United States Patent
Lee

(10) Patent No.: US 7,710,030 B2
(45) Date of Patent: May 4, 2010

(54) DOUBLE SIDED AMOLED DISPLAY AND FABRICATING METHOD THEREOF

(75) Inventor: Chung-Chun Lee, Lunbei Township, Yunlin County (TW)

(73) Assignee: Au Optronics Corp., Hsin-Chu (TW)

( * ) Notice: Subject to any disclaimer, the term of this patent is extended or adjusted under 35 U.S.C. 154(b) by 358 days.

(21) Appl. No.: 11/371,856

(22) Filed: Mar. 9, 2006

(65) Prior Publication Data
US 2007/0057629 A1 Mar. 15, 2007

(30) Foreign Application Priority Data
Sep. 9, 2005 (TW) .............................. 94131234 A

(51) Int. Cl.
*H01J 1/62* (2006.01)
(52) U.S. Cl. .................. 313/511; 313/504; 313/512
(58) Field of Classification Search ................ 313/504, 313/506, 512, 511; 428/212, 332, 690, 917
See application file for complete search history.

(56) References Cited

U.S. PATENT DOCUMENTS

| | | | |
|---|---|---|---|
| 2003/0189400 A1* | 10/2003 | Nishio et al. ................ | 313/504 |
| 2004/0075628 A1 | 4/2004 | Chien et al. .................... | 345/82 |
| 2004/0212300 A1* | 10/2004 | Chao et al. .................... | 313/506 |
| 2005/0024339 A1* | 2/2005 | Yamazaki et al. ............ | 345/169 |
| 2005/0048314 A1* | 3/2005 | Antoniadis et al. ........... | 428/690 |
| 2005/0057149 A1* | 3/2005 | Herranen et al. ............ | 313/504 |
| 2005/0179378 A1* | 8/2005 | Oooka et al. ................. | 313/512 |

FOREIGN PATENT DOCUMENTS

| | | | |
|---|---|---|---|
| JP | 2004171858 A * | 6/2004 | |
| TW | 556135 | 10/2003 | |
| TW | 586096 | 5/2004 | |
| WO | WO 2005036935 A1 * | 4/2005 | |

OTHER PUBLICATIONS

English translation of JP 2004171858A.*
"Dual-Sided Display" Su, et al.; U.S. Appl. No. 11/136,568, filed May 25, 2005.

* cited by examiner

*Primary Examiner*—Nimeshkumar D. Patel
*Assistant Examiner*—Mary Ellen Bowman
(74) *Attorney, Agent, or Firm*—Thomas, Kayden, Horstemeyer & Risley

(57) ABSTRACT

A double sided display comprises a first substrate, a first organic light-emitting device (OLED) disposed on the first substrate, a first spacer, a second substrate, a second OLED disposed on the second substrate and a second spacer. The first and second spacers are disposed on the first and second substrates, and close to the first and second OLEDs, respectively. A height of the first spacer is larger than a thickness of the first OLED. A height of the second spacer is larger than a thickness of the second OLED. During assembly, the first substrate is disposed opposite to the second substrate, and the first spacer is disposed opposite to the second spacer. Also, the exact positions of the first and second spacers are determined for preventing the direct touch between the first and second OLEDs while the double sided display is deformed.

31 Claims, 1 Drawing Sheet

DOUBLE SIDED AMOLED DISPLAY AND FABRICATING METHOD THEREOF

This application claims the benefit of Taiwan application Serial No. 094131234, filed Sep. 9, 2005, the subject matter of which is incorporated herein by reference.

BACKGROUND OF THE INVENTION

1. Field of the Invention

The invention relates in general to a double sided display and fabricating method thereof, and more particularly to the double sided AMOLED display constructed for preventing the direct touch between the organic light-emitting devices (OLEDs) and fabricating method thereof.

2. Description of the Related Art

With the increasing demand of the electronic products, especially the products with portability, the displays having great functions such as quick response, high resolution and vivid image have been developed. Besides the operational functions, it is one of major trends to develop an electronic product with lighter weight, smaller size, and even thinner form. Also, a double sided-type display is commonly applied for providing the user a more integrated electronic product.

Conventionally, a double sided-type display is constructed by integrating two liquid crystal displays (LCDs). For example, two LCDs can be assembled back-to-back to provide a double sided-type display. This conventional displayer disadvantageously possesses a bulky appearance (ex. about 8 mm to 10 mm in thick). Also, it increases the cost that the LCDs of the double sided-type display have to be fabricated individually before proceeding the assembling step. Thus, assembling the LCDs is not a proper design for making the double sided-type display. Regarding to a dual electroluminescent display (and denoted as "double sided display hereinafter), it can be easily constructed by interposing two organic light-emitting devices (OLEDs) between two substrates (i.e. an upper substrate and a lower substrate). The resulting assembly of the double sided displayer not only possesses dual-panel function but also satisfy the requirements of lightweight, small size (thinner body in particular) and easy to carry.

However, the OLEDs disposed on the substrates of the double sided display may direct touch each other, while the substrates are deformed (e.g. bended) resulting from an external force unduly exerted on the display or the weight of the substrates itself. The OLEDs improperly touching each other may leave scratches on the cathodes of the OLEDs or cause current leakage during the operation, so as to degrade the image quality of the double sided display.

SUMMARY OF THE INVENTION

It is therefore an object of the present invention to provide an double sided display and fabricating method thereof for preventing the electroluminescent devices from direct touch by arranging the particular spacers at the predetermined positions; thus, the operational lifetime of the display is prolonged.

The present invention achieves the objects by providing a double sided display, comprising a first substrate; a first organic light-emitting device (OLED) formed on the first substrate; at least one first spacer disposed on the first substrate and close to the first OLED; a second substrate substantially opposite to the first substrate; a second OLED, formed on the second substrate and disposed opposite to the first OLED; and at least one second spacer disposed on the second substrate and close to the second OLED, and the first spacer is substantially in alignment with the second spacer. Also, a height of the first spacer is larger than a thickness of the first OLED, and a height of the second spacer is larger than a thickness of the second OLED.

The present invention achieves the objects by providing a method for fabricating a double sided display, comprising:

providing a first substrate;

forming a first organic light-emitting device (OLED) on the first substrate;

disposing at least one first spacer on the first substrate and close to the first OLED, wherein a height of the first spacer is larger than a thickness of the first OLED;

providing a second substrate;

forming a second OLED on the second substrate;

disposing at least one second spacer on the second substrate and close to the second OLED, wherein a height of the second spacer is larger than a thickness of the second OLED; and assembling the first substrate and the second substrate, and the first OLED substantially corresponding to the second OLED, and at least one first spacer is substantially in alignment with the second spacer.

Other objects, features, and advantages of the present invention will become apparent from the following detailed description of the preferred but non-limiting embodiment. The following description is made with reference to the accompanying drawings.

DETAILED DESCRIPTION OF THE INVENTION

Figure 1:
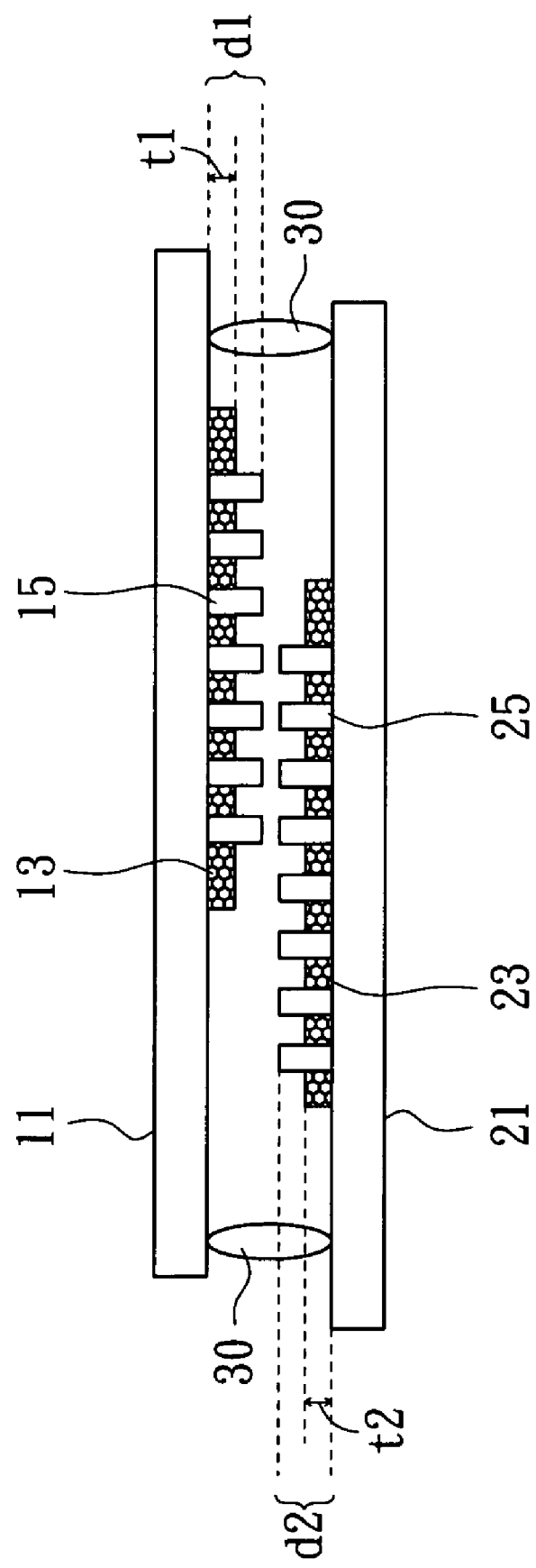
FIG. 1 schematically illustrates a double sided display according to the preferred embodiment of the present invention.

In the present embodiment of the invention, a double sided display and fabricating method thereof are disclosed. It is noted that the embodiment disclosed herein is used for illustrating the present invention, but not for limiting the scope of the present invention. Additionally, the drawings used for illustrating the embodiments of the present invention only show the major characteristic parts in order to avoid obscuring the present invention. Accordingly, the specification and the drawings are to be regard as an illustrative sense rather than a restrictive sense.

FIG. 1 schematically illustrates a double sided display according to the preferred embodiment of the present invention. The double sided display comprises a first substrate 11, a first organic light-emitting device (OLED) 13 disposed on the first substrate 11, at least a first spacer 15, a second substrate 21, a second OLED 23 disposed on the second substrate 21 and at least a second spacer 25. The second substrate 21 is substantially opposite to the first substrate 11. The first spacers 15 are disposed on the first substrate 11 and close to the first OLED 13, and the second spacer 25 are disposed on the second substrate 21 and close to the second OLED 23. The positions of the first spacer spacers 15 and the second spacers 25 are associated; for example, the first spacers 15 are in alignment with the second spacers 25. Also, in the practical application, both of the first spacer 15 and the second spacers 25 preferably contain a photoactive polymer. Examples of the photoactive polymer include epoxy resin, polyimide, phenolic resin, acryl resin and the like.

Noted that the height d1 of the first spacer 15 is larger than the thickness t1 of the first OLED 13, and the height d2 of the second spacer 25 is larger than the thickness t2 of the second OLED 23. Besides, it is known that the associated positions of the first spacers 15 and the second spacers 25 may include several conditions, such as the first spacers 15 and the second spacers 25 being arranged symmetrically, or the portions of the first spacers 15 and the second spacers 25 being overlapped. When the first substrate 11 and the second substrates 21 are deformed (e.g. bended) resulting from an external force unduly exerted thereon or the weight of the substrates itself, the first spacers 15 and the second spacers will touch each other first for protecting the first OLED 13 and the second OLED 23 from damage.

In other word, the positions of the first spacers 15 and the second spacers 25 are optionally determined for preventing the direct touch between the first OLED 13 and second OLED 23 while the double sided display is deformed. In the practical fabrication, if one of the first spacers 15 and the second spacers 25 is settled, the position of the other spacer is limited consequently.

Moreover, the configuration of the first spacer 15 and the second spacer 25 has no limitation. In a practical application, the first spacers 15 and the second spacers 25 could be shaped as the strips, and the positions thereof are partially overlapped or symmetrically arranged. The height d1 of the first spacer 15 and the height d2 of the second spacer 25 are preferably about 0.1 μm to 50 μm. In the other application, several spherical objects could be distributed on the first substrate 11 and the second substrate 21, functioning as the first spacers 15 and the second spacers 25. Also, the positions of the first spherical spacers 15 and the second spherical spacers 25 are preferably symmetrical. If the display is deformed, the first spherical spacers 15 and the second spherical spacers 25 can touch each other for protecting the OLED from direct contact. The average first diameter of the first spherical spacers 15 and the average second diameter of the second spherical spacers 25 are preferably about 0.1 μm to 50 μm.

Additionally, the organic electroluminescent layer of the first OLED 13 and second OLED 23 may contain materials forming molecule-based light-emitting diodes substantially comprising the dyestuffs or pigments, or materials forming polymer-based light emitting. The light-emitting materials used in the first OLED 13 and second OLED 23 are not limited herein. Also, the image data received by the first OLED 13 and the second OLED 23 at a given time could be substantially identical or different. Besides, the first OLED 13 and the second OLED 23 of the embodiment could be both driven by the passive matrix method (i.e. the double sided display denoted as a passive matrix organic light-emitting display (PMOLED)), or both driven by the active matrix method (i.e. the double sided display denoted as a active matrix organic light-emitting display (AMOLED)), or respectively driven by the passive and active matrix methods, depending on the requirements of the applications.

A method of fabricating the double sided display as shown in FIG. 1 is disclosed as follows. First, a first substrate 11 and a second substrate 21 are provided. The material of the first substrate 11 and the second substrate 21 could be glass or plastics with good transparency. A first light-emitting device (OLED) 13 is further formed on the first substrate 11. A first protective layer (not shown) can be optionally formed on the first OLED 13 for the purpose of protection. Then, a first spacer 15 is disposed on the first substrate 11 and close to the first OLED 13. The height d1 (e.g. the thickness or the diameter) of the first spacer 15 is larger than the thickness t1 of the first OLED 13. Similarly, a second OLED 23 is formed on the second substrate 21. A second protective layer (not shown) can be optionally formed on the second OLED 23 for the purpose of protection. The second spacer 25 is then disposed on the second substrate 21 and close to the second OLED 23. The height d2 (e.g. the thickness or the diameter) of the second spacer 25 is larger than the thickness t2 of the second OLED 23. To make a complete assembly, the first substrate 11 and the second substrate 21 are opposite placed together by providing a sealing adhesive 30 on one of the first substrate 11 and the second substrate 21. Alternatively, the first and second protective layers can be optionally formed before the fabrication of the first and second, respectively.

Furthermore, a first polarized film (not shown) can be optionally attached to the first substrate 11. Noted that the first polarized film and the first OLED 13 are positioned at the different sides of the first substrate 11. Similarly, a second polarized film (not shown) can be optionally attached to the second substrate 21. Noted that the second polarized film and the second OLED 23 are positioned at the different sides of the second substrate 21.

According to the aforementioned description, the double sided display and fabricating method thereof use the spacers disposed at the associated positions of the first (i.e. upper) and second (i.e. lower) substrates, to make sure the gap (space between the substrates) varied within an acceptable range. When the substrates are deformed (e.g. bended) resulting from an external force unduly exerted on the display or the weight of the substrates itself, it has no direct touch between the OLEDs due to the arrangement of the spacers. Therefore, the convention problems such as scratches on the cathodes of the OLEDs or current leakage can be solved, and the operational lifetime of the double sided display is prolonged.

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A double sided display, comprising:
a first substrate;
a first organic light-emitting device (OLED) formed on the first substrate;
at least a plurality of first spacers independently disposed on the first substrate and distributed at positions within the area of the first OLED correspondingly, and parts of the first spacers being disposed close to and along a lateral side of the first OLED;
a second substrate substantially opposite to the first substrate;
a second OLED formed on the second substrate, wherein the second OLED is disposed opposite to the first OLED, and a gap is formed between the first and second substrates;
at least a plurality of second spacers independently disposed on the second substrate and distributed at positions within the area of the second OLED correspondingly, and parts of the second spacers being disposed close to and along a lateral side of the second OLED, wherein only parts, but not all, of the first spacers are substantially in alignment with corresponding parts of the second spacers; and
a sealing adhesive adhering the first substrate and the second substrate;
wherein a height of the first spacer is larger than a thickness of the first OLED and smaller than a depth of the gap, and a height of the second spacer is larger than a thickness of the second OLED and smaller than the depth of the gap.

2. The double sided display of claim 1, wherein the first spacer and the second spacer are strip-shaped.

3. The double sided display of claim 1, wherein the first spacer has a height of about 0.1 µm to 50 µm.

4. The double sided display of claim 1, wherein the second spacer has a height of about 0.1 µm to 50 µm.

5. The double sided display of claim 1, wherein at least one first spacer comprises a first spherical spacer, and at least one second spacer comprises a second spherical spacer disposed substantially in alignment with the first spherical spacer.

6. The double sided display of claim 5, wherein the first spherical spacer has a diameter of about 0.1 µm to 50 µm.

7. The double sided display of claim 5, wherein the second spherical spacer has a diameter of about 0.1 µm to 50 µm.

8. The double sided display of claim 1, wherein at least one of the first spacer and the second spacer comprises a photoactive polymer.

9. The double sided display of claim 1, wherein at least one of the first OLED and the second OLED comprises a small molecule-based OLED.

10. The double sided display of claim 1, wherein at least one of the first OLED and the second OLED comprise a polymer-based OLED.

11. The double sided display of claim 1, wherein image data received by the first OLED is substantially different from image data received by the second OLED at the same time.

12. The double sided display of claim 1, wherein image data received by the first OLED is substantially identical to image data received by the second OLED at the same time.

13. The double sided display of claim 1, wherein at least one of the first OLED and the second OLED is driven by an active matrix method.

14. The double sided display of claim 1, wherein at least one of the first OLED and the second OLED is driven by a passive matrix method.

15. A method for fabricating a double sided display, comprising:
providing a first substrate;
forming a first organic light-emitting device (OLED) on the first substrate;
disposing at least a plurality of first spacers independently on the first substrate and distributed at positions within the area of the first OLED correspondingly, and parts of the first spacers being disposed close to and along a lateral side of the first OLED, wherein a height of the first spacer is larger than a thickness of the first OLED;
providing a second substrate;
forming a second OLED on the second substrate;
disposing at least a plurality of second spacers independently on the second substrate and distributed at positions within the area of the second OLED correspondingly, and parts of the second spacers being disposed close to and along a lateral side of the second OLED, wherein a height of the second spacer is larger than a thickness of the second OLED; and
assembling the first substrate and the second substrate by providing a sealing adhesive to adhere the first and second substrates, and the first OLED substantially corresponding to the second OLED, wherein a gap is formed between the first and second substrates after assembly, and only parts, but not all, of the first spacers are substantially in alignment with corresponding parts of the second spacers; the height of the first spacer is smaller than a depth of the gap, and the height of the second spacer is smaller than the depth of the gap.

16. The double sided display of claim 1, wherein the first spacer is projected toward the second substrate, and the second spacer is projected toward the first substrate.

17. The double sided display of claim 1, wherein a top end of the first spacer is apart from the second substrate, and a top end of the second spacer is apart from the first substrate.

18. The double sided display of claim 1, wherein the depth of the gap is larger than a sum of the heights of the corresponding first and second spacers.

19. The double sided display of claim 1, wherein the first substrate and the second substrate are assembled by a sealing adhesive, and a height of the sealing adhesive is larger than a sum of the heights of the corresponding first and second spacers.

20. The double sided display of claim 1, wherein when the display are deformed, the first spacer touches the corresponding second spacer for preventing the first OLED and the second OLED from direct contact.

21. The method of claim 15, wherein the first substrate and the second substrate are assembled by a sealing adhesive when assembling, and a height of the sealing adhesive is larger than a sum of the heights of the corresponding first and second spacers.

22. The method of claim 15, wherein the depth of the gap is larger than a sum of the heights of the corresponding first and second spacers after assembling the first substrate and the second substrate.

23. The method of claim 15, wherein the first spacer is projected toward the second substrate, and the second spacer is projected toward the first substrate after assembling the first substrate and the second substrate.

24. The method of claim 15, wherein a top end of the first spacer is apart from the second substrate, and a top end of the second spacer is apart from the first substrate after assembling the first substrate and the second substrate.

25. The method of claim 15, wherein when the assembled display are deformed, the first spacer touches the corresponding second spacer for preventing the first OLED and the second OLED from direct contact.

26. The double sided display of claim 1, wherein the first spacers are located at positions correspondingly within a display region of the first substrate, and the second spacers are located at positions correspondingly within a display region of the second substrate.

27. The double sided display of claim 1, wherein the first spacers are distributed at positions correspondingly within the lateral side of the first OLED, and the second spacers are distributed at positions correspondingly within the lateral side of the second OLED.

28. The method of claim 15, wherein the first spacers are disposed at positions correspondingly within a display region of the first substrate, and the second spacers are disposed at positions correspondingly within a display region of the second substrate.

29. The method of claim 15, wherein the first spacers are distributed at positions correspondingly within the lateral side of the first OLED, and the second spacers are distributed at positions correspondingly within the lateral side of the second OLED.

30. The double sided display of claim 1, wherein parts of the first OLED and the second OLED are overlapped spatially, and parts of the first spacers substantially aligned with the corresponding second spacers form a plurality of alignment pairs of the first and second spacers, which prevent the direct touch between an overlapping portion of the first and second OLEDs while the double sided display is deformed.

31. The method of claim 15, wherein parts of the first OLED and the second OLED are overlapped spatially, and parts of the first spacers substantially aligned with the corresponding second spacers form a plurality of alignment pairs of the first and second spacers, which prevent the direct touch between an overlapping portion of the first and second OLEDs while the double sided display is deformed.

* * * * *